(12) United States Patent
Wang et al.

(10) Patent No.: US 6,671,086 B1
(45) Date of Patent: Dec. 30, 2003

(54) SEMICONDUCTOR OPTICAL AMPLIFIERS WITH BROADENED GAIN SPECTRUM

(75) Inventors: Steve Wang, San Jose, CA (US); Frank Levinson, Palo Alto, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/134,845

(22) Filed: Apr. 29, 2002

Related U.S. Application Data
(60) Provisional application No. 60/358,072, filed on Feb. 19, 2002.

(51) Int. Cl.[7] .................................................. H01S 3/00
(52) U.S. Cl. ..................................... 359/344; 359/337.1
(58) Field of Search ............................... 359/344, 337.1

(56) References Cited

U.S. PATENT DOCUMENTS 6,249,373 B1 * 6/2001 Woodward .................. 359/344
6,512,629 B1 * 1/2003 Dijaili et al. ................ 359/344

FOREIGN PATENT DOCUMENTS

JP    02000040852 A   *   2/2000
JP    02000114670 A   *   4/2000

* cited by examiner

*Primary Examiner*—Mark Hellner
(74) *Attorney, Agent, or Firm*—Workman Nydegger

(57) ABSTRACT

Semiconductor optical amplifier with flattened or balanced gain across a spectrum of wavelengths. A gain balancing layer is formed on a semiconductor optical amplifier. The optical amplifier has an active region that includes one or more quantum wells of varying thickness and the gain balancing layer changes the optical confinement of some of the quantum wells to varying degrees. The gain balancing layer is etched or formed to a thickness that causes the semiconductor optical amplifier to have a flattened or balanced gain across a broad spectrum of wavelengths.

21 Claims, 3 Drawing Sheets

SEMICONDUCTOR OPTICAL AMPLIFIERS WITH BROADENED GAIN SPECTRUM

RELATED APPLICATION

This application claims the benefit of U.S. Provisional Patent Application Ser. No. 60/358,072, entitled "Semiconductor Optical Amplifiers with Broadened Gain Spectrum," filed Feb. 19, 2002, which is incorporated herein by reference.

BACKGROUND OF THE INVENTION

1. The Field of the Invention

The present invention relates to semiconductor optical amplifiers. More particularly, the present invention relates to semiconductor optical amplifiers and super luminance edge emitting light emitting diodes with a broadened gain spectrum where the gain of optical signals of varying wavelengths is balanced across a spectrum of wavelengths.

2. Background and Relevant Art

Optical communication systems have several advantages over other types of telecommunications networks. Optical fibers are typically made from insulative materials and are therefore less susceptible to interference from electromagnetic sources. Optical fibers also have higher bandwidth capability. In addition, optical fibers are both smaller and lighter than metal cables.

As optical signals are transmitted through the optical fibers of the communication network, the optical signals gradually become weaker over distance. Thus, the optical signals are typically refreshed or strengthened before the signals become too weak to detect. Before the advent of optical amplifiers, regenerators were used to refresh or strengthen the weakened optical signals. Regenerators convert the optical signal to an electrical signal, clean the electric signal, and convert the electrical signal back to an optical signal for continued transmission in the optical communication network.

Optical amplifiers, on the other hand, are superior to regenerators because optical amplifiers can amplify light signals of multiple wavelengths simultaneously while regenerators can only amplify one channel or a single wavelength. One type of optical amplifier is a semiconductor optical amplifier (SOA). At a basic level, an SOA includes multiple layers of compound semiconductor materials that are grown on a semiconductor substrate. An SOA usually includes an active layer and two cladding layers. The active layer provides optical gain to a light signal and the cladding layers together with the active or core layer, construct a optical waveguide.

The facets of the SOA are formatted by cleaving the semiconductor wafer along the crystal plane such that a mirror is formed. An antireflective (AR) coating is often applied to at least one facet in order to decrease the facet reflection. When an optical signal is injected at the input facet of the SOA, the light is amplified in the active layer by the gain of the SOA.

In some amplifiers, the active layer includes a pair of compound semiconductor material layers to confine the electrons inside the active layer. An extra pair of cladding layers is often needed to confine the optical mode. These extra layers of the SOA structure are a separate confinement structure that confine the optical modes. Thus, the electrons and the optical modes are confined separately by different layers.

Another problem associated with quantum wells is that the gain of optical signals varies according to the wavelengths of the optical signals being amplified. This problem is caused, for example, by the type of material included in the quantum wells of the active region. The thickness of the quantum wells also has an impact on the gain of the optical signal that is partly dependent on the wavelength of the incident optical signal.

In other words, semiconductor optical amplifiers suffer from the inability to provide the same or similar gain to optical signals across a spectrum of wavelengths. This is problematic for various reasons. For example, designing and engineering optical networks becomes more difficult as specific wavelengths of light must be considered instead of a spectrum of wavelengths.

BRIEF SUMMARY OF THE INVENTION

These and other problems are overcome by the present invention which is directed to semiconductor optical amplifiers that generate essentially the same gain for optical signals of different wavelengths across a spectrum of wavelengths. The gain of optical signals within spectrum of wavelengths is flattened. The present invention is also directed to edge emitting light emitting diodes (edge emitting LEDs) whose structure is similar to semiconductor optical amplifiers.

The gain of a semiconductor optical amplifier can be flattened or made more constant by adding a gain balancing layer to the structure of a semiconductor optical amplifier or an edge emitting LED. The gain balancing layer effectively repositions an optical signal within an active region of the semiconductor optical amplifier such that the optical confinement factor of thin quantum wells is increased. By increasing the confinement factor of some quantum wells or of the active region as a whole, the gain of different wavelengths can be balanced.

One example of an active region of a semiconductor optical amplifier includes quantum wells where the quantum wells have different thicknesses with respect to the other quantum wells. In some instances, the quantum wells may be compressively strained quantum wells and/or tensile strained quantum wells. Alternatively, the quantum wells are neither compressively strained or tensile strained. After the active region has been formed and the cladding layers have also been formed around the active region, the gain balancing layer is added or formed to the structure of the semiconductor optical amplifier.

The gain balancing layer changes the overall refractive index such that the optical signal is repositioned within the active region. The gain balancing layer also has the effect of increasing the optical confinement of thinner quantum wells. With a gain balancing layer of appropriate thickness, the gain of the semiconductor optical amplifier can be balanced or flattened across a spectrum of wavelengths.

The gain balancing layer changes the refractive index profile of the semiconductor optical amplifier in the vertical direction such that the optical mode (or optical spot) is repositioned within the active regions. The spot of the optical signal propagating through the active layer can be adjusted in the vertical direction by changing a thickness of the gain balancing layer. By gain of the semiconductor optical amplifier can be flattened across a spectrum of wavelengths by adjusting the thickness of the gain balancing layer.

The proper thickness of the gain balancing layer can be determined by etching the gain balancing layer to different thicknesses. The gain of optical signals with different wavelengths are then measured to determine which thickness of the gain balancing layer enables the semiconductor optical amplifier to balance the gain across a spectrum of wavelengths. In this manner, the semiconductor optical amplifier has a gain that is balanced or flattened across wavelengths within the spectrum of wavelengths amplified by the semiconductor amplifier.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
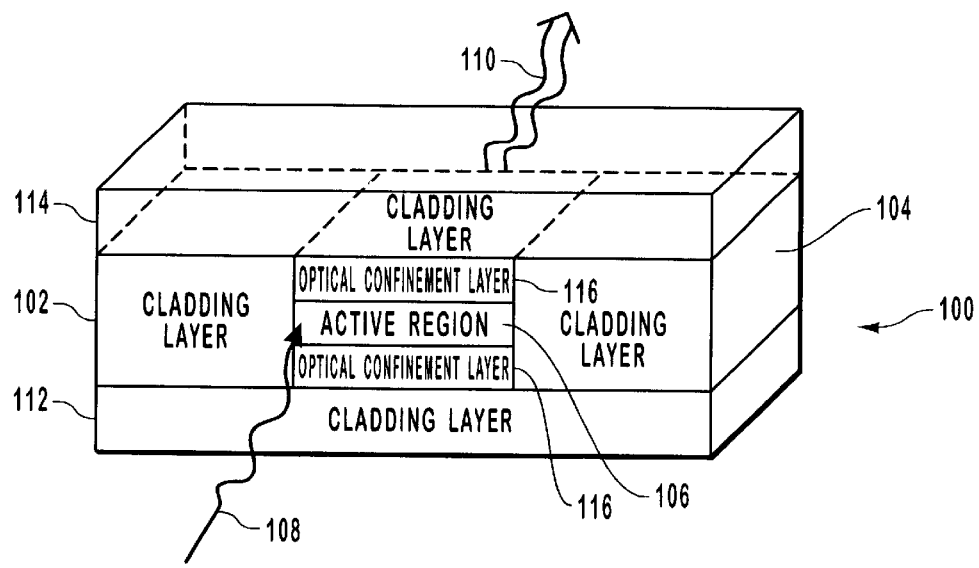
FIG. 1 illustrates a semiconductor optical amplifier where an active region is confined by cladding layers.

Semiconductor optical amplifiers (SOAs) typically amplify light signals through the principle of stimulated emission. A semiconductor optical amplifier has a conduction band for high mobility electrons, and two valence bands of low mobility holes: a light hole valance band and a heavy hole valence band. The valence band(s) and the conduction band are separated by an energy gap and no energy levels exist in the energy gap. When an electron from the conduction band transitions to the light hole valance band, the gain is TE mode gain and when the transition is from the conduction band to the heavy hole valence band, the gain is TM mode gain. The conduction band is typically the higher energy band and the energy refers to electron energy.

If no bias is applied to the SOA, the concentration of electrons in the conduction band is relatively small. When a forward bias is applied to the SOA (often a pn-junction) a population inversion may be achieved such that the concentration of electrons in the conduction band is significantly higher. In the presence of an optical signal, electrons are exited at the conduction band and transmitted to the valence band by the process of stimulated emission. Meanwhile, there are electrons going from the valence band to the conduction band which generate spontaneous emission. When an electron transitions from a higher energy level to a lower energy level, a photon is emitted that has the same energy and wavelength as the incident photon. These emitted photons thus amplify the optical signal.

Typically however, the SOAs used to amplify optical signals are more complex than a simple pn-junction. Often, another semiconductor material is sandwiched or formed between the p-type and n-type regions of the SOA to form an active region or layer. The bandwidth of the active layer is $E_g$ and the active region may include two optical confinement layers which have a band gap of $E_g + \Delta E_g$. The extra bandwidth is for the carrier confinement. Often, the active region is a strip of semiconductor materials that is surrounded by p and n type semiconductor materials (cladding layers) that have lower refractive indexes. The active region typically has a higher refractive index than the surrounding p-type and n-type regions of the SOA, thus confining the light during amplification to the active region. The active region may also have a smaller energy band gap than surrounding layers in order to confine the carriers that are injected into the active region.

As previously described, the active region of an SOA can introduce some undesirable effects. In particular, the gain provided by the SOA is often dependent on the wavelength of the incident optical signal or photon. Certain wavelengths may be amplified more than other wavelengths. The present invention is directed to an SOA that has balanced or flattened gain across a spectrum of wavelengths and to methods of manufacturing SOAs that have balanced or flattened gain across a spectrum of wavelengths. Although the present invention is discussed in terms of a semiconductor optical amplifier, it is understood that the present invention can apply to other optical devices such as edge emitting LEDs and other optical amplifiers.

FIG. 1 is a block diagram that illustrates an example of a semiconductor optical amplifier. The SOA 100 includes an active region 106 that is formed between a cladding layer 114 and a cladding layer 112. The cladding layer 114 may be an n-type semiconductor material while the cladding layer 112 is a p-type semiconductor material. The active region 106 of the SOA 100 also typically includes another cladding layer in the same plane as the active region 106 as illustrated by the cladding layers 102 and 104. The cladding layers 102 and 104 are also formed from a semiconductor material that has a lower refractive index than the active region 106. The cladding layers 102 and 104 can be either p-type or n-type materials. The plane of semiconductor material including the active region 106 between the cladding layers 114 and 112 can be formed, for example, using masking principles known in the art.

The active region 106 is also formed of semiconductor material, but the active region 106 is typically not the same material as the cladding layers or material. The active region 106 usually has a refractive index that is higher than the cladding layers. This property of the active region 106 helps insure that the active region 106 functions as a wave guide for the optical signal that is amplified by the SOA 100. The active region 106 also includes an additional pair of optical confinement layers 116. The refractive index of the optical confinement layers 116 is usually between the refractive index of the cladding layers and the rest of the active region 106. The optical confinement layers 116 confine the optical modes.

The layers of the semiconductor optical amplifier are typically formed from compound semiconductor materials that have different bandgaps that the substrate but that are lattice matched to the substrate (InP or GaAs substrate, for example). For strained quantum wells, the lattice constant of the wells is different such that the strain is applied from the barrier layer where the lattice matches the substrate. The quantum wells range in thickness from 3 nanometers to 8 nanometers, the barrier layers average 10 nanometers in thickness and the cladding layers 112 and 114 average 100 nanometers. These ranges are exemplary, but it is understood that the present invention is not limited to these ranges.

In this example, an optical signal 108 is introduced into the active region 106 and, when the SOA 100 is forward biased such that a population inversion is present, the stimulated emission of electrons from the higher energy band generates photons with the same energy and wavelength as the incident optical signal, thereby amplifying the optical signal 108 and producing the amplified optical signal 110.

Figure 2:
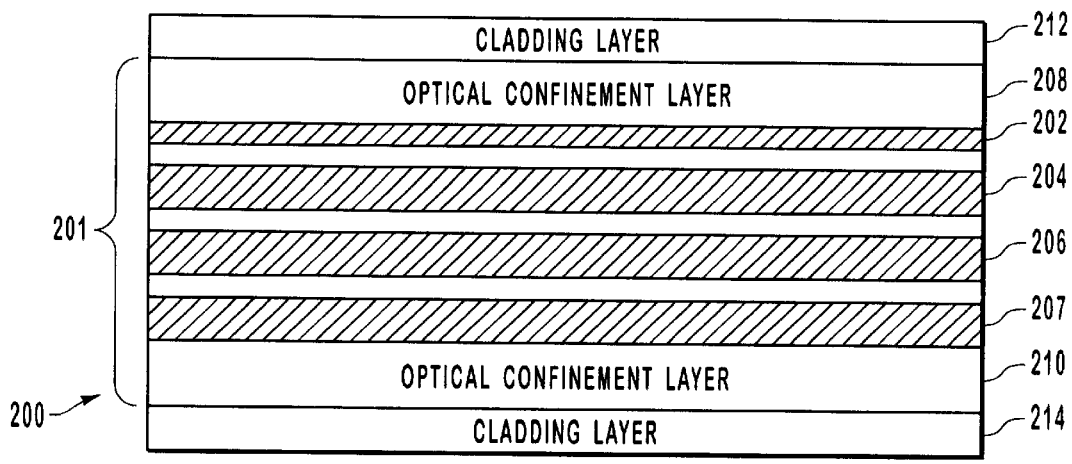
FIG. 2 is a block diagram that illustrates the active region a semiconductor optical amplifier and includes quantum wells of varying thickness.

FIG. 2 is a block diagram that more fully illustrates an exemplary active region that includes quantum wells. The active region 201 includes one or more quantum wells 202, 204, 206, and 207. These quantum wells can be compressively strained, tensile strained, not strained, or any combination thereof. Tensile strained quantum wells have the effect of enhancing the TM mode gain while compressively strained quantum wells have the effect of enhancing the TE mode gain. In this example, the quantum wells also have different thicknesses. Thus, the quantum well 207 is thicker than the quantum wells 206, 204, and 202. The quantum well 206 is thicker than the quantum wells 204, and 202. Because this example is illustrative in nature, it is understood that this principle applies to active regions that have quantum wells of varying combinations of type and thickness. It is further understood that the active region is not limited to quantum wells but may comprise bulk semiconductor material, quantum spots, and the like.

Figure 3:
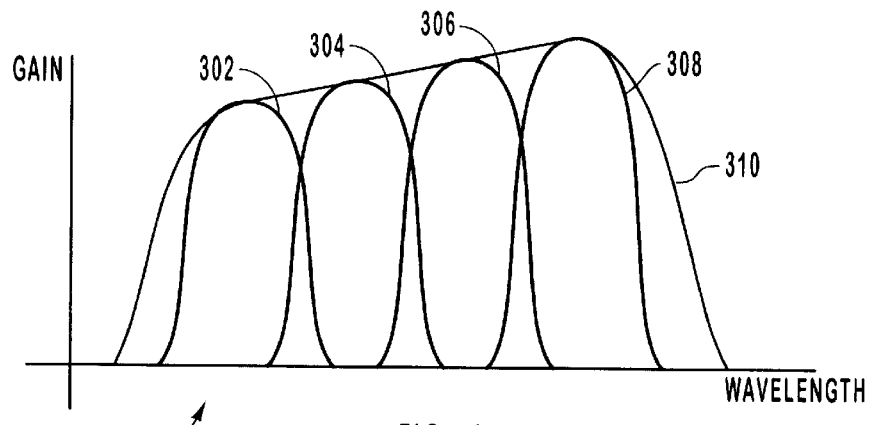
FIG. 3 illustrates the unbalanced gain of optical signals that have different wavelengths using the semiconductor optical amplifier of FIG. 2.

The SOA 200 of FIG. 2 amplifies optical signals as previously described. However, each quantum well typically has a different confinement factor that is related to the thickness of the quantum well. This is illustrated in FIG. 3, which plots the gain of optical signals by their wavelength. In general, the gain of the SOA 200 is dependent in part on the wavelength of the incident optical signal. More specifically, the gain 302 can be attributed to at least one quantum well, while the gain 304, 306, and 308 can be attributed to other quantum wells or to a combination of quantum wells in the active region 201 of the SOA 200. The gain 310 is not balanced or flattened across the spectrum of wavelengths illustrated in FIG. 3.

Figure 4:
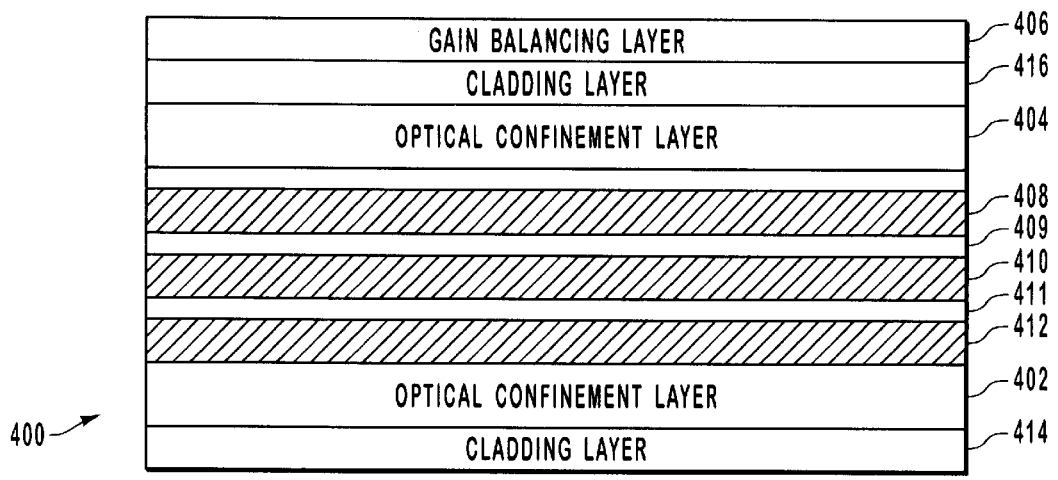
FIG. 4 illustrates a gain balancing layer formed or added to a semiconductor optical amplifier that balances or flattens the gain of optical signals across a spectrum of wavelengths that pass through the active region of the semiconductor optical amplifier.

FIG. 4 illustrates an SOA 400 that is able to effectively adjust the intensity or position of the optical signal/modes such that the gain of the optical signal/modes is not as dependent on the thickness of the quantum wells. In FIG. 4, a gain balancing layer 406 is formed on the structure of the SOA 400. While FIG. 4 only illustrates a single gain balancing layer 406, it is understood that more than one gain balancing layer may be formed on the SOA 400 on one or both sides of the active region.

When an optical signal is received or is incident into the SOA 400, the optical confinement of one or more of the quantum wells 408, 410, and 412 is increased (or decreased in some circumstances) by the gain balancing layer 406. As previously described, the gain balancing layer 406 changes the overlap of the optical signal/modes and the quantum wells of the active region. The thickness of the gain balancing layer 406 determines how much of the optical signal overlaps the active region, which has an effect on the gain of the optical signal. In other words, the gain of an optical signal can be increased or decreased as the thickness of the gain balancing layer 406 is changed to alter how an optical signal overlaps or interacts with the quantum wells in the active regions. The optical confinement factor thus describes how an optical signal overlaps the active region.

By changing the thickness of the gain balancing layer 406, or gain flattening layer, optical signals of varying wavelengths can be amplified in a manner that flattens or balances the gain of the SOA 400 across a spectrum of wavelengths. The refractive index of the gain balancing layer is typically lower than the refractive index of the active region but higher that the refractive index of the cladding layers.

For example, the active region of the SOA 400 includes the quantum wells 408, 410, and 412 and these quantum wells are separated by barrier layers 409, and 411. Optical confinement layers 404 and 402 bound the quantum wells. As an optical signal propagates through the active region, it gains according to its wavelength and its effective position within the active region. The effective position or intensity of the propagation of an optical signal through a semiconductor optical amplifier is more fully illustrated in FIG. 5.

Figure 5:
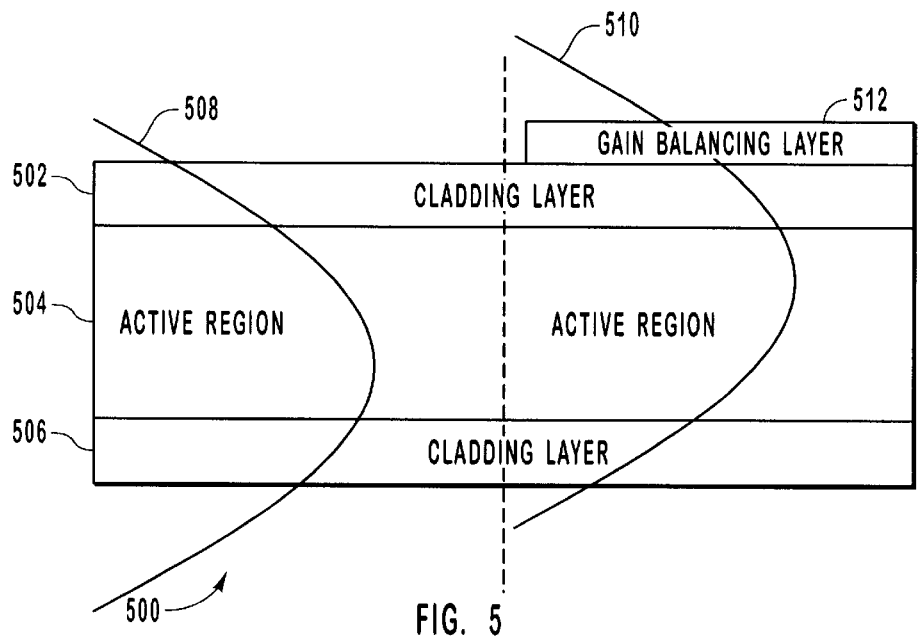
FIG. 5 illustrates how an optical signal propagates through the active region of a semiconductor optical amplifier both with and without a gain balancing layer.

In FIG. 5, the active region 504 has one or more quantum wells of varying thickness. The thinner quantum wells are near the cladding layer 502. For illustration purposes, part of the SOA 500 has a gain balancing layer 512 while the other part of the SOA 500 does not. An optical signal 508 is propagating through the portion of the SOA 500 that does not have a gain balancing layer while the same optical signal (shown as the optical signal 510) is propagating through the portion of the SOA 500 that includes the gain balancing layer 510. The curves or signals 508 and 510 represent the intensities of the corresponding optical signals/modes as they vary across the vertical dimension of the SOA 500.

As illustrated, the optical signal 510 is repositioned closer to the cladding layer 502 within the active region 504 such that the intensity of the optical signal 510 is more focused in the thinner quantum wells of the active region 504. The gain balancing layer 512 changes the optical confinement factor of one or more of the quantum wells in the active region such that the gain of the SOA 500 across a particular spectrum of wavelengths is balanced or flattened. In other words, balancing the gain of the SOA 500 across the spectrum of wavelengths indicates that the gains are closer in amplitude than if the gain balancing layer were not present.

Figure 6:
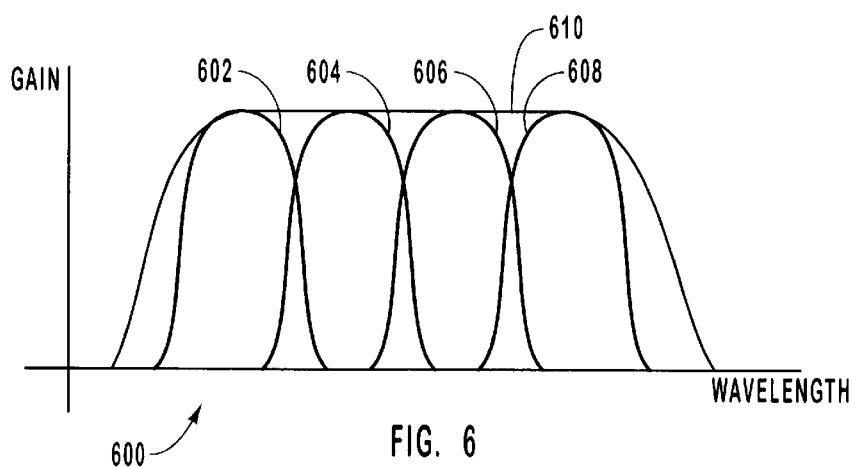
FIG. 6 illustrates the balanced or flattened gain of optical signals that have different wavelengths using the semiconductor optical amplifier of FIG. 4 that includes a gain balancing layer.

The flattened or balanced gain of optical signals of varying wavelengths is illustrated in FIG. 6. The gains 502, 504, 506, and 508 are essentially the same even though the wavelengths of the corresponding optical signals are different. The gain 610 of the SOA across the spectrum of wavelengths illustrated in FIG. 6 is more balanced or flattened than, as shown in FIG. 3, the gain 310 of a semiconductor amplifier that does not include a gain balancing layer. In some instances, the spectrum of wavelengths amplified by semiconductor amplifiers that include a gain balancing layer is broadened.

FIG. 4 also serves to illustrate one example of how an SOA can be fabricated or manufactured such that the gain of optical signals amplified by the SOA is balanced or flattened across a spectrum of wavelengths. The SOA is typically grown on a substrate of InP or GaAs, for example. Next, The optical confinement layer 402 is grown or formed on the cladding layer 414, which is often an n or p type semiconductor material. The quantum wells, which can be compressively strained, tensile strained or unstrained, are then formed on the optical confinement layer 402. Exemplary quantum wells have a thickness on the order of 3 nanometers to 8 nanometers while the barrier layers have a thickness on the order of 10 nanometers. The active region, for example, may be composed of five quantum wells that are separated by 4 barrier layers and each side of the active region is bounded by an cladding layer on the order of 100 nanometers. It is understood that this example is illustrative in nature and that the present invention is not limited to these ranges or materials.

Next, the optical confinement layer 404 is grown or formed on the quantum wells and the upper cladding layer 416 is formed on the optical confinement layer 404. Finally, the gain balancing layer may be formed or grown on the cladding layer 416. The gain balancing layer 406 can be formed at a later time such that the gain of the semiconductor optical amplifier can be changed.

In one example, many of the layers are group II and group V semiconductors (such as $InGa_{1-x}As_yP_{1-y}$). For an InP substrate, a AlInGaAs material may be used while InGaAs/AlGaAs/GaAs is typically used for a GaAs substrate. The materials used in forming the semiconductor optical amplifier are known in the art.

After the gain balancing layer 406 is formed, it may be necessary to ascertain the thickness of the gain balancing layer that results in a balanced or flattened gain. In one example, the SOA 400 can be passed through an etching solution using, for example, a stepping motor. With each advance of the stepping motor or other etching control, more of the gain balancing layer is submerged in the etching solution. Thus some of the gain balancing layer is etched longer than other portions of the gain balancing layer. As the stepping motor passes the SOA through the etching solution, steps are etched into the gain balancing layer and each step has a different thickness.

Figure 7:
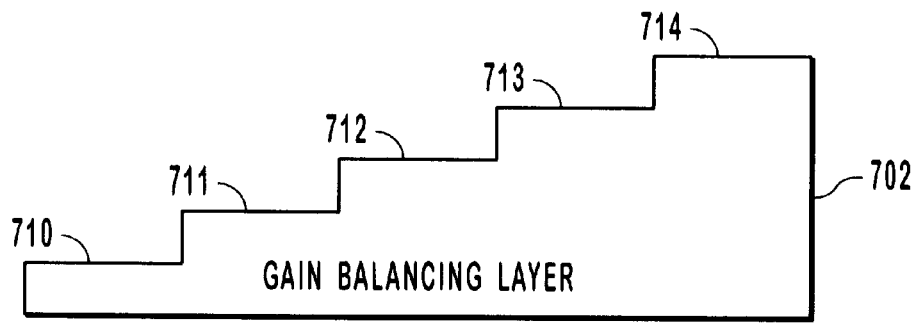
FIG. 7 illustrates a gain balancing layer that has been etched to different thicknesses to determine which thickness results in a balanced or flattened gain across a spectrum of wavelengths.

This creates a gain balancing layer 702, as shown in FIG. 7, that has one or more steps. This example illustrates the steps 710, 711, 712, 713, and 714 and each step of the gain balancing layer 702 has a different thickness. Optical signals of different wavelengths may now be used to determine which step(s) of the gain balancing layer 702 cause the semiconductor optical amplifier to produce a gain that is flat or balanced across the spectrum of wavelengths. In other words, the thickness of the gain balancing layer moves the optical signal within the active region such that gain attributable to the thinner quantum wells is increased and more balanced with the gain attributable to the thicker quantum wells. Once the appropriate thickness of the gain balancing layer is determined, the gain balancing layer can be etched to the appropriate thickness and SOAs that are produce a flattened or balanced gain across a spectrum of different wavelengths can be fabricated or produced.

Figure 8:
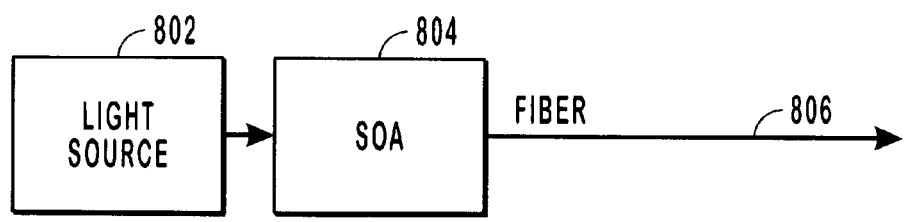
FIG. 8 is an exemplary system wherein the present invention may be implemented.
Figure 8:

FIG. 8 is a block diagram that illustrates an exemplary use of a semiconductor optical amplifier with a gain balancing layer. FIG. 8 illustrates an optical signal source 802 that is amplified by a SOA 804. The output of the SOA 804 is coupled with a fiber 806. The source 802 generates a light signal that may have, for example, multiple wavelengths. Alternatively, the source 802 may generate optical signals of different wavelengths at different times.

The SOA 804 includes a gain balancing layer as described above and is able to generate the same or similar gain for the incident optical signal created by the light source 802 regardless of the wavelength of the incident optical signal. One advantage of this system is that the design of the optical network 800 is simplified because the gain of a spectrum of wavelengths can be considered as opposed to considering a single wavelength.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A semiconductor optical amplifier that balances gain of optical signals within a spectrum of wavelengths, the semiconductor optical amplifier comprising:

a first cladding layer and a second cladding layer;

an active region that is bounded by the first cladding layer and the second cladding layer;

a plurality of quantum wells within the active region, wherein at least one of the plurality of quantum wells has a thickness that is different from at least one of the other quantum wells in the active region;

a gain balancing layer formed on the first cladding layer, wherein the gain balancing layer increases an optical confinement factor of at least one of the plurality of quantum wells such that a gain of an optical signal within the spectrum of wavelengths is balanced with the gain of other optical signals within the spectrum of wavelengths.

2. A semiconductor optical amplifier as defined in claim 1, wherein the first cladding layer is formed from an n-type semiconductor material and wherein the second cladding layer is formed from a p-type semiconductor material.

3. A semiconductor optical amplifier as defined in claim 1, wherein the active region is positioned in a plane between the first cladding layer and the second cladding layer and wherein a third cladding layer is positioned in the plane on both sides of the active region.

4. A semiconductor optical amplifier as defined in claim 1, wherein the plurality of quantum wells are separated by barrier layers.

5. A semiconductor optical amplifier as defined in claim 1, wherein at least one of the plurality of quantum wells is compressively strained.

6. A semiconductor optical amplifier as defined in claim 1, wherein at least one of the plurality of quantum wells is tensile strained.

7. A semiconductor optical amplifier as defined in claim 1, wherein the gain balancing layer has a thickness, wherein the thickness has been selected to adjust the optical confinement factor of at least one quantum well.

8. A semiconductor optical amplifier as defined in claim 1, further comprising a second gain balancing layer on the second cladding layer.

9. A semiconductor optical amplifier as defined in claim 1, wherein the active region further comprises a pair of optical confinement layers that bound the plurality of quantum wells and wherein the pair of optical confinement layers confine an optical mode.

10. A semiconductor optical amplifier as defined in claim 1, wherein the active region has a refractive index that is greater that a refractive of the first cladding layer and the second cladding layer and wherein the gain balancing layer has a refractive index that is lesser than the refractive index of the active region and greater than the refractive index of the first cladding layer and greater than the refractive index of the second cladding layer.

11. A semiconductor optical amplifier that flattens a gain of the optical signals that have a wavelength within a spectrum of wavelengths, the semiconductor optical amplifier comprising:
   an active region that includes a plurality of quantum wells that are separated by barrier layers, wherein each quantum well in the active region has a thickness that is different from a thickness of at least one other quantum well;
   an n-type semiconductor material layer and a p-type semiconductor material layer that are connected such that the active region forms a strip between the n-type semiconductor material layer and the p-type semiconductor material layer; and
   a gain balancing layer positioned on either the n-type semiconductor material layer or the p-type semiconductor material layer, wherein the gain balancing layer increases an optical confinement factor of at least one of the plurality of quantum wells such that the gain of optical signals within the spectrum of wavelengths is flattened.

12. A semiconductor optical amplifier as defined in claim 11, wherein at least one of the plurality of quantum wells is compressively strained.

13. A semiconductor optical amplifier as defined in claim 11, wherein at least one of the plurality of quantum well is tensile strained.

14. A semiconductor optical amplifier as defined in claim 11, wherein the active region has an index of refraction that is greater than the n-type semiconductor material layer and greater than the p-type semiconductor material layer and wherein the gain balancing layer has an index of refraction that is less than the index of refraction of the active region and greater than the index of refraction of the n-type semiconductor material and the p-type semiconductor material.

15. A semiconductor optical amplifier as defined in claim 11, wherein the gain balancing layer has a thickness, wherein the thickness of the gain balancing layer determines how the optical confinement factor of at least one quantum well is changed.

16. A semiconductor optical amplifier as defined in claim 11, wherein the gain balancing layer causes a region of maximum intensity of optical signals that propagate through the active region to be moved toward the gain balancing layer.

17. A method for fabricating a semiconductor optical amplifier that flattens a gain of the optical signals that have a wavelength within a spectrum of wavelengths, the method comprising:
   forming an active region on a first cladding layer, wherein the active region includes a plurality of quantum wells and wherein each quantum well has a thickness that is different from a thickness of another quantum well in the active region;
   forming a second cladding layer on the active region such that the active region forms a strip between the first cladding layer and the second cladding layer; and
   forming a gain balancing layer on the second cladding layer such that a gain of the semiconductor optical amplifier is balanced across a spectrum of wavelengths.

18. A method as defined in claim 17, wherein forming a gain balancing layer on the second cladding layer further comprises:
   determining a thickness of the gain balancing layer; and
   etching the gain balancing layer to the thickness.

19. A method as defined in claim 18, wherein determining a thickness of the gain balancing layer further comprises:
   passing the gain balancing layer through an etching solution in steps such that the gain balancing layer has one or more steps, wherein each step has a different thickness; and
   determining which step balances the gain of the semiconductor optical amplifier across a spectrum of wavelengths using one or more optical signals within the spectrum of wavelengths to test each step of the gain balancing layer.

20. A method for flattening a gain of a semiconductor optical amplifier that has an active region that includes a plurality of quantum wells of varying thickness across a spectrum of wavelengths, the method comprising:
   forming a gain balancing layer on an cladding layer of the semiconductor optical amplifier, wherein the gain balancing layer increases a confinement factor of at least one of the plurality of quantum wells;
   etching the gain balancing layer such that the gain balancing layer includes one or more steps, wherein each step has a different thickness;
   identifying a particular step that balances a gain of the semiconductor optical amplifier across the spectrum of wavelengths; and
   etching the gain balancing layer to a thickness of the particular step such that the semiconductor optical amplifier has a balanced gain across the spectrum of wavelengths.

21. A method as defined in claim 20, further comprising forming a second gain balancing layer on another cladding layer of the semiconductor optical amplifier.

* * * * *